United States Patent [19]

Albert

[11] Patent Number: 4,990,880
[45] Date of Patent: Feb. 5, 1991

[54] TRANSFORMER CLIP

[75] Inventor: Guy D. Albert, Raleigh, N.C.

[73] Assignee: Alcatel NA, Inc., Hickory, N.C.

[21] Appl. No.: 384,741

[22] Filed: Jul. 24, 1989

[51] Int. Cl.$^5$ ............... H01F 15/02; H01F 27/26
[52] U.S. Cl. ................... 336/65; 248/316.7;
  248/505; 336/83; 336/210
[58] Field of Search ........... 248/500, 505, 510, 316.7,
  248/309.1, 314, 27.3, 231.8; 336/65, 83, , 210

[56] References Cited

U.S. PATENT DOCUMENTS

| 3,471,815 | 10/1969 | Grant et al. | 336/83 |
| 3,533,589 | 10/1970 | Schellmann | 336/83 X |
| 4,549,158 | 10/1985 | Mitsui et al. | 336/40 X |

FOREIGN PATENT DOCUMENTS

| 1380363 | 10/1964 | France | 336/83 |
| 1394554 | 2/1965 | France | 336/83 |
| 2556879 | 6/1985 | France | 336/65 |
| 903319 | 8/1962 | United Kingdom | 336/83 |

Primary Examiner—Thomas J. Kozma
Attorney, Agent, or Firm—Peter C. Van Der Sluys

[57] ABSTRACT

A mounting device for mechanically retaining separable transfomer core portions together and attaching the transformer assembly to a printed circuit board utilizing a flat clip body and a vertically aligned spring unit to minimize the transformer assembly height and four mounting legs to allow easy installation and removal.

11 Claims, 2 Drawing Sheets

TRANSFORMER CLIP

BACKGROUND OF THE INVENTION

1. Field of the Invention

The present invention relates to transformer clips used to retain transformers on printed circuit boards, and, more particularly, to an improved transformer clip for use in high density electronic systems, wherein said clip uses a spring action to retain a magnetic core assembly together while encompassing minimum space above the board.

2. Description of the Prior Art

Transformers are required in electronic circuits for various reasons, such as transforming a high voltage to a lower voltage level, to provide isolation, inter alia. For minimum power loss, it is necessary to mount the transformers in proximity to their associated circuit hardware. Methods have been devised to mount the transformers on printed circuit boards (PCBs), which are utilized in electronics because the wiring between components can be done effectively with minimum line length, resulting in less line loss, and with maximum isolation, resulting in less spurious and/or coupled noise.

The accustomed practice of mounting transformers onto PCBs is generally accomplished by inserting the legs of the transformer, or of its casing, through pre-drilled holes in the PCB and soldering the legs to the bottom of the board. This allows for simple installation and removal. The transformer terminals, which are cut to a specified length, are also inserted into pre-drilled holes to contact the appropriate conductive path for the circuit.

Further development of the PCB-mounted transformer has yielded a transformer component in which portions of a magnetic core are wound with conductive material and are thereafter held together with a clip. Alternatively, a spool can be wound with wire and encased between core portions. The clip is formed in a spring-like configuration to exert a compressive force on the magnetic core portions while providing legs for mounting the transformer to the PCB. Prior configurations of the spring-like transformer clips included clips utilizing a spring located on the top of the clip to compress the core components together, as well as those employing a spring situated on the bottom of the clip for compression.

As the electronics technology has advanced, the need for smaller, more compact electronics assemblies has increased. To accommodate the need for more compact assemblies, a higher density of PCBs per assembly is desired. The spacing limitation between two PCBs, although limited by thermodynamic and electrical limitations inherent in electronic assemblies, is naturally constrained to the height of the tallest component on the board below. Because most of the components used on PCBs are integrated circuits (ICs), resistors, and capacitors, which are all fairly low lying, transformers tend to be one of the taller components used. It is critical that their height be kept to a minimum to maximize the number of PCBs that may be employed in a card rack of predetermined width.

As can be seen in FIGS. 1 and 2, transformer halves 10 of a prior art transformer assembly 20 are held in juxtaposition utilizing the transformer clip 12. The assembly 20 is held to the PCB 14 by legs 16 of the clip 12 which are inserted into holes in the PCB 14 and are attached thereto using solder 15. A spring-like configuration 17 of the clip 12 compresses the two transformer halves 10 together. Because the clip spring 17 is configured on the top, as in FIG. 1, or on the bottom of the clip, as in FIG. 2, the transformer clip height is not minimized, thereby not allowing maximization of PCB density.

SUMMARY OF THE INVENTION

The present invention will be described as a clip for a transformer assembly for use on a PCB. However, it should be noted that its application is general enough to be extended to clip any components used on any board.

The present invention incorporates, for the minimization of transformer height on a PCB, a transformer clip which compresses the transformer components together using a spring-like configuration on each side, thus leaving the top and bottom surfaces flat. The spring-like configurations terminate with inwardly extending flanges that grip the bottom surface of the lower transformer portion. The flanges are seated in holes formed in the PCB such that the transformer's bottom surface juxtaposes the PCB. A plurality of legs extend downwardly for mounting the assembly to the PCB. This unique configuration and mounting method effectively reduces the transformer assembly height to the physical height of the two transformer portions plus the thickness of the clip. The present invention thus reduces the minimum height of the assembly from the prior art by the amount of the spring configuration height plus the thickness of the clip material. This reduction in transformer height will allow a higher density of PCBs per electronic assembly to be utilized.

Accordingly, a principal object of the present of the invention is to provide a simple and easily-installable transformer clip which will minimize the transformer height and thus allow maximum PCB density.

Other objects and advantages of the invention will become apparent from the detailed description which follows.

For a fuller understanding of the nature and objects of the invention, reference should be had to the following detailed description taken in connection with the accompanying drawings.

DESCRIPTION OF THE PREFERRED EMBODIMENT

Figure 3:
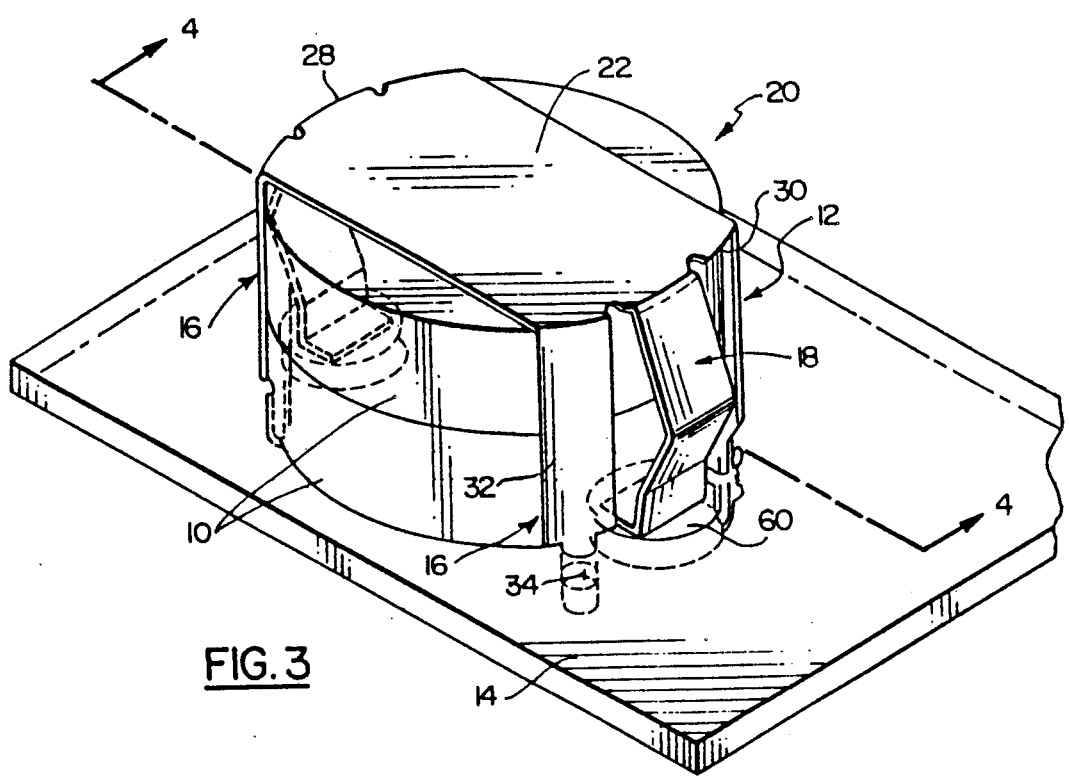
FIG. 3 is a perspective view of a PCB-mounted transformer utilizing the transformer clip of the present invention, shown in its operative condition.

Referring to FIG. 3, a transformer assembly 20 is shown in its operative configuration mounted to a PCB 14. The assembly 20 is comprised of a transformer clip 12 and two transformer portions 10, which, when assembled, make up a transformer. Each transformer portion 10 is an annular magnetic core wound with conductive material whose physical characteristics (i.e., conductor gauge, number of turns on core, etc.) are dependent upon the type of transformer desired. The two transformer portions 10 are placed atop one another and clipped together utilizing the transformer clip 12.

The transformer clip 12 is formed of a thin, malleable metallic material and includes a clip body 22, four mounting legs 16, and two spring arms 18. The clip body 22 has two arcuate ends 28 and 30 which are shaped to snugly fit on the top transformer portion 10. The ends are shaped with substantially the same radius of curvature as the transformer portion 10.

Extending vertically in a downward direction from both ends of the clip body 22 are six appendages: four mounting legs 16 and two spring arms 12. Each leg 16 is comprised of a leg body 32, whose length is substantially the same as the transformer assembly height, and a thin extension 34, whose length is slightly greater than the PCB thickness. Each leg 16 on end 28 of the clip body 22 is diametrically opposite a leg 16 on end 30 of the clip body 22. Each leg 16 is substantially flat and has a thickness equal to that of the clip material used. The legs 16 lie in planes perpendicular to the clip body 22 and tangential to the arcs of the clip body ends at their points of juncture. The two legs 16 on each end 28 and 30 are disposed on each side of each spring arm 18.

Figure 1:
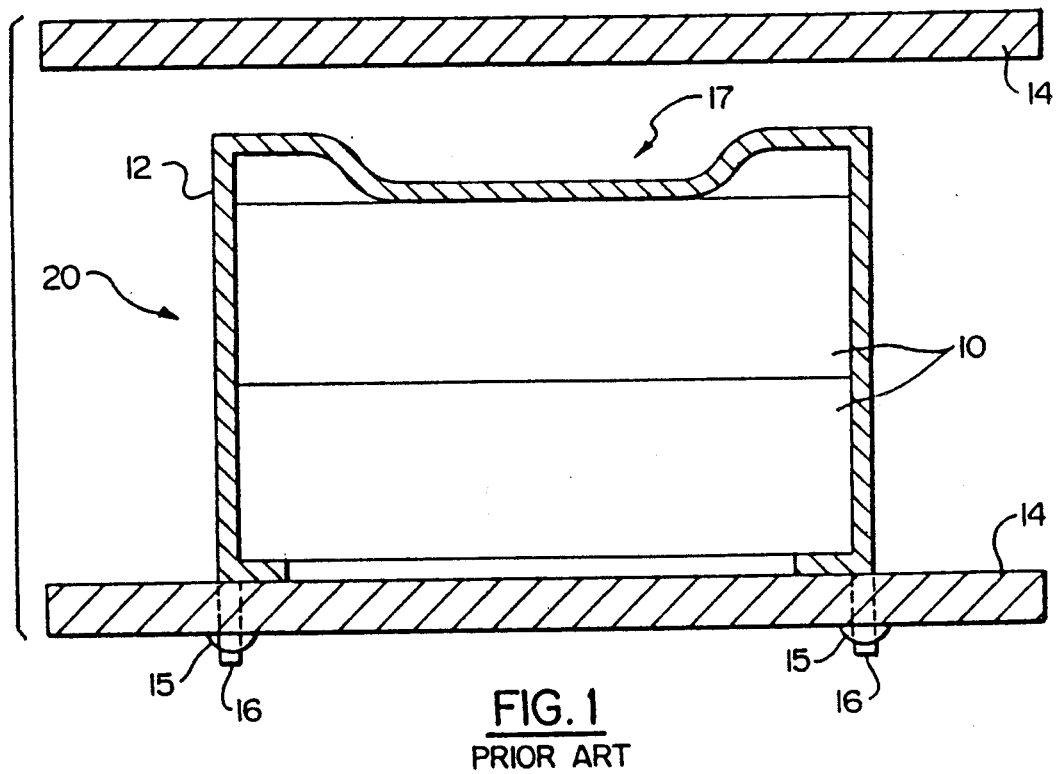
FIG. 1 is a side elevation view of a prior art transformer clip in its operative condition, shown in cross-section taken along a plane through its center point and perpendicular to the PCB.
Figure 2:
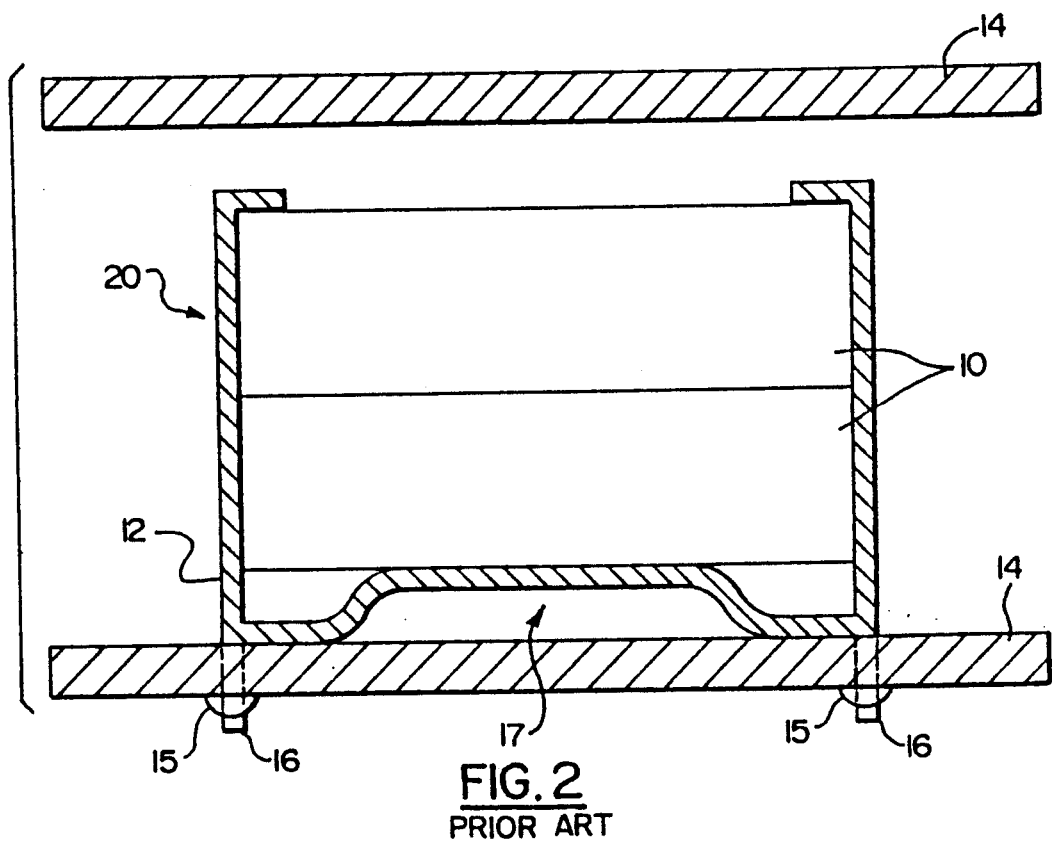
FIG. 2 is a side elevation view of another prior art transformer clip in its operative condition, shown in cross-section taken along a plane through its center point perpendicular to the PCB.
Figure 4:
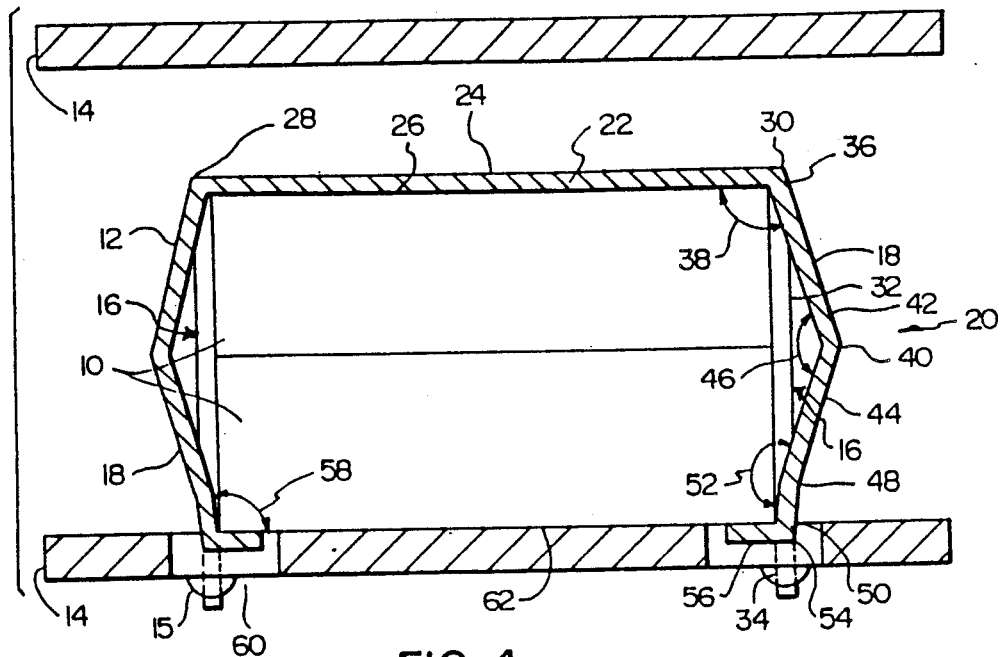
FIG. 4 is a side elevation view of the present invention in its operative condition, shown in cross-section taken along line 4—4 shown in FIG. 3.

Each spring arm 18 is also a long, thin appendage from the clip body 22 and is comprised of four portions defined by bends along its length. Referring to FIG. 4, the first bend of the clip spring 18 is at a shoulder 36, or the clip body 22/clip spring 18 junction. This shoulder angle 38 is somewhere between 90° and 135°, preferably at 120°. The second bend is at an elbow 40 between an upper arm 42 and a lower arm 44. The angle 46 of the elbow is between 90° and 135°, preferably at 120°. The third bend is at a wrist 48, between the lower arm 44 and a hand 50. The wrist angle 52 is between 180° and 225°, preferably at 210°. The wrist angle 52 is such that the hand 50 is parallel to a transformer assembly center axis. Finally, the last bend, at a knuckle 54, connects the hand 50 to a spring finger 56. The knuckle angle 58 is approximately 90° and is placed in a position such that the two transformer portions 10 are compressed slightly, between the clip body 22 and the spring finger 56 when the transformer and clip are assembled. It should be noted that these angles and component lengths may be varied slightly and the transformer clip will remain functionally equal, that is, the two transformer halves 10, when inserted in the transformer clip 12, will be forced to remain in juxtaposition.

Finally, to completely minimize any vertical height added to the transformer assembly 20 by the transformer clip 12, the PCB 14 is bored with two clearance holes 60 referring to FIG. 3. The clearance holes 60 are cylindrical in shape with a center axis orthogonal to the PCB plane. Its horizontal area must be such that a spring finger 56, lying parallel to the PCB as in operation, will easily fit inside hole 60. These holes 60 are drilled such that when the transformer assembly 20 is in its operative position, as shown in FIG. 3, both spring fingers 56 lay completely below the PCB 14 surface and the transformer bottom 62 juxtaposes the PCB 14 surface. This further limits the transformer clip's contribution to the total transformer assembly height to the thickness of the clip material.

What is claimed is:

1. An apparatus of single-piece construction for assembling and mounting electronic components, which are of the type including multiple separable sections, to a board used to hold electronic components, said apparatus comprising:
    a body formed of a thin, flat metallic material for engaging a top component surface opposite a bottom component surface that is to engage said board;
    two spring arms formed integrally with said body and extending downwardly alongside said component;
    a finger attached to each of said spring arms for engaging said bottom component surface, said spring arms adapted to provide a spring force through said fingers and said body to compress said component sections together; and
    mounting means including at least two legs formed integrally with said body and extending downwardly alongside said component for engaging and mounting to said board, whereby the apparatus may be used to assemble said component sections and mount them to the board.

2. An apparatus as described in claim 1, wherein each spring arm bends outwardly away from the component sections at a mid-portion thereof to facilitate a spring action and to provide the spring force.

3. An apparatus as described in claim 1, wherein said legs extend downwardly and are spaced about the component and adapted to engage the component sections and hold them in a predetermined alignment, said legs each terminating in a means for mounting to said board.

4. An apparatus as described in claim 1, wherein the component is a transformer having separable core portions.

5. An electronic assembly, comprising:
    a printed circuit board for mounting and interconnecting electronic components, said board having top and bottom parallel surfaces separated by a predetermined thickness and through holes to facilitate mounting said components;
    an electronic component formed of a plurality of separable sections, said component having a top surface and a bottom surface juxtaposed with the top surface of said board; and
    a clip of single-piece construction assembling and mounting said component, said clip including a body engaging the top surface of the component, two spring arms formed integrally with said body and extending downwardly alongside of said component, a finger attached to each of said spring arms engaging the bottom surface of the component, said spring arms providing a spring force through said fingers and said body to compress the component sections together, and mounting means including at least two legs formed integrally with said body and extending downwardly alongside said component engaging and mounting said component to the printed circuit board.

6. An electronic assembly as described in claim 5, wherein each spring arm bends outwardly away from the component sections at a mid-portion thereof to facilitate a spring action and provide the spring force.

7. An electronic assembly as described in claim 5, wherein said legs extend downwardly and are spaced about the component and engaging the component sections for holding them in a predetermined alignment, said legs each terminating in a means for mounting to said board.

8. An electronic assembly as described in claim 5, wherein the component is a transformer having separable core portions.

9. An electronic assembly as described in claim 8, wherein said core portions are cylindrical, having a predetermined radius of curvature, and said top and bottom transformer surfaces are flat, said body includes arcuate ends having substantially the same radius of curvature as said core portions, said legs extending downwardly from the arcuate ends and engaging the core portions for holding them in a predetermined alignment, said legs each terminating in a means for attaching to said printed circuit board.

10. An electronic assembly as described in claim 9, wherein the means for attaching to said board formed at the end of each leg comprises an appendage extending downwardly from the leg and through a hole formed in the circuit board for attaching to the circuit board.

11. An electronic assembly as described in claim 5, wherein the printed circuit board has formed therein holes in which are disposed the fingers of said spring arms so that the bottom surface of the component may completely engage the top surface of the board, and the overall height of the electronic assembly is kept to a minimum.

* * * * *